US012576640B2

(12) United States Patent
Fujimura et al.

(10) Patent No.: US 12,576,640 B2
(45) Date of Patent: Mar. 17, 2026

(54) LIQUID DISCHARGE HEAD, LIQUID DISCHARGE DEVICE, AND LIQUID DISCHARGE APPARATUS

(71) Applicants: Yuki Fujimura, Kanagawa (JP); Keishi Miwa, Kanagawa (JP); Toshiaki Masuda, Kanagawa (JP)

(72) Inventors: Yuki Fujimura, Kanagawa (JP); Keishi Miwa, Kanagawa (JP); Toshiaki Masuda, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 358 days.

(21) Appl. No.: 18/132,451

(22) Filed: Apr. 10, 2023

(65) Prior Publication Data

US 2023/0330990 A1 Oct. 19, 2023

(30) Foreign Application Priority Data

Apr. 15, 2022 (JP) .................................. 2022-067767

(51) Int. Cl.
| | |
|---|---|
| *B41J 2/14* | (2006.01) |
| *H10N 30/20* | (2023.01) |
| *H10N 30/88* | (2023.01) |

(52) U.S. Cl.
CPC ......... *B41J 2/14233* (2013.01); *B41J 2/1433* (2013.01); *H10N 30/2023* (2023.02); *H10N 30/883* (2023.02); *B41J 2002/14241* (2013.01)

(58) Field of Classification Search
CPC .................. B41J 2/14233; B41J 2/1433; B41J 2002/14241; B41J 2202/11; H10N 30/2023; H10N 30/883; H10N 30/2047
See application file for complete search history.

(56) References Cited

U.S. PATENT DOCUMENTS

| | | | |
|---|---|---|---|
| 7,530,675 B2 * | 5/2009 | Domoto .............. B41J 2/14233 |
| | | | 347/70 |
| 2017/0100934 A1 | 4/2017 | Masuda et al. | |
| 2017/0253040 A1 | 9/2017 | Shinkai et al. | |
| 2018/0370237 A1 | 12/2018 | Mizukami et al. | |
| 2019/0044055 A1 | 2/2019 | Kondo et al. | |

(Continued)

FOREIGN PATENT DOCUMENTS

| | | | |
|---|---|---|---|
| EP | 1199171 A2 * | 4/2002 | .......... B41J 2/14233 |
| JP | 2012-171196 | 9/2012 | |

(Continued)

OTHER PUBLICATIONS

English machine translation of Masanori JP-2015054501-A (Year: 2015).*

(Continued)

*Primary Examiner* — Douglas X Rodriguez
*Assistant Examiner* — Natasha Dephenia Quinn
(74) *Attorney, Agent, or Firm* — XSENSUS LLP

(57) ABSTRACT

A liquid discharge head includes: a nozzle plate including a nozzle; a liquid chamber substrate having an individual chamber; a diaphragm; a piezoelectric actuator including a piezoelectric body, a wiring portion covering a first region of the piezoelectric actuator; and a protective film covering a second region of the piezoelectric actuator other than the first region. A first outer periphery of the piezoelectric body in the second region is interior of a second outer periphery of the individual chamber in the second region. A gap region between the first outer periphery and the second outer periphery has: a first gap region having a first width in the longitudinal direction; and a second gap region having a second width in a transverse direction orthogonal to the longitudinal direction, the second width larger than the first width. The protective film covers a part of the first gap region in the second region.

10 Claims, 12 Drawing Sheets

(56) References Cited

U.S. PATENT DOCUMENTS

| | | | |
|---|---|---|---|
| 2019/0270310 A1 | 9/2019 | Masuda et al. | |
| 2019/0275796 A1 | 9/2019 | Miwa | |
| 2020/0276816 A1* | 9/2020 | Naito | B41J 2/14233 |
| 2020/0298569 A1 | 9/2020 | Miwa | |
| 2021/0016568 A1 | 1/2021 | Miwa | |
| 2021/0036208 A1 | 2/2021 | Shimofuku et al. | |
| 2021/0039393 A1 | 2/2021 | Mizukami et al. | |
| 2021/0162759 A1 | 6/2021 | Miwa et al. | |
| 2021/0252862 A1 | 8/2021 | Masuda et al. | |
| 2021/0370675 A1 | 12/2021 | Yoshita et al. | |
| 2022/0097373 A1 | 3/2022 | Masuda | |
| 2022/0242123 A1 | 8/2022 | Hirabayashi et al. | |
| 2023/0021821 A1 | 1/2023 | Kuroda et al. | |
| 2023/0049164 A1 | 2/2023 | Toyota et al. | |

FOREIGN PATENT DOCUMENTS

| | | | |
|---|---|---|---|
| JP | 2012171196 A * | 9/2012 | |
| JP | 2015-054501 | 3/2015 | |
| JP | 2015054501 A * | 3/2015 | |

OTHER PUBLICATIONS

English machine translation of Shimada EP-1199171-A1 (Year: 2002).*

English machine translation of Yoshihiro JP-2012171196-A (Year: 2012).*

U.S. Appl. No. 18/116,323, filed Mar. 2, 2023, Kazuto Nagahashi, et al.

U.S. Appl. No. 17/954,349, filed Sep. 28, 2022, Keishi Miwa.

U.S. Appl. No. 17/956,833, filed Sep. 30, 2022, Keishi Miwa.

U.S. Appl. No. 17/956,838, filed Sep. 30, 2022, Keishi Miwa.

U.S. Appl. No. 17/959,301, filed Oct. 4, 2022, Toshiaki Masuda, et al.

U.S. Appl. No. 17/964,963, filed Oct. 13, 2022, Toshiaki Masuda.

U.S. Appl. No. 17/966,909, filed Oct. 17, 2022, Yuki Fujimura, et al.

U.S. Appl. No. 17/972,880, filed Oct. 25, 2022, Yuu Sugioka, et al.

U.S. Appl. No. 18/088,779, filed Dec. 27, 2022, Yukimasa Matsuda, et al.

* cited by examiner

COMPARATIVE EXAMPLE 1

COMPARATIVE EXAMPLE 1

COMPARATIVE EXAMPLE 1

FIG. 8A
COMPARATIVE
EXAMPLE 2

FIG. 8B
COMPARATIVE
EXAMPLE 2

FIG. 8C
COMPARATIVE
EXAMPLE 2

LIQUID DISCHARGE HEAD, LIQUID DISCHARGE DEVICE, AND LIQUID DISCHARGE APPARATUS

CROSS-REFERENCE TO RELATED APPLICATIONS

This patent application is based on and claims priority pursuant to 35 U.S.C. § 119(a) to Japanese Patent Application No. 2022-067767, filed on Apr. 15, 2022, in the Japan Patent Office, the entire disclosure of which is incorporated by reference herein.

BACKGROUND

Technical Field

The present disclosure relates to a liquid discharge head, a liquid discharge device, and a liquid discharge apparatus.

Related Art

An image forming apparatus including a liquid discharge head that discharges liquid such as ink to a recording medium has been developed. The liquid ejection head includes a nozzle that discharges liquid, a liquid chamber (also referred to as an individual liquid chamber, a pressurizing liquid chamber, an ink flow path, or the like) communicated with the nozzle, and a pressure generator that generates pressure in the liquid in the liquid chamber.

The pressure generator may include a piezoelectric actuator. The piezoelectric actuator includes a diaphragm forming a part of a wall surface of the liquid chamber and a piezoelectric element having a structure in which an electromechanical transducer film made of a piezoelectric body is held between a lower electrode and an upper electrode. When a voltage is applied to the lower electrode and the upper electrode, the piezoelectric body vibrates so as to deform the diaphragm.

SUMMARY

An embodiment of the present disclosure provides a liquid discharge head including: a nozzle plate including a nozzle from which a liquid is to be discharged; a liquid chamber substrate on the nozzle plate, the liquid chamber substrate having an individual chamber communicating with the nozzle; a diaphragm on the liquid chamber substrate, the diaphragm defining a part of a wall of the individual chamber; a piezoelectric actuator on the diaphragm, the piezoelectric actuator including a piezoelectric body configured to deform the diaphragm in response to a drive voltage applied to the piezoelectric body; a wiring portion connected to the piezoelectric actuator to apply the drive voltage to the piezoelectric body of the piezoelectric actuator, the wiring portion covering a first region of the piezoelectric actuator; and a protective film covering a second region of the piezoelectric actuator other than the first region. The first region is at one end of the piezoelectric actuator in a longitudinal direction of the individual chamber. The second region is at another end of the piezoelectric actuator in the longitudinal direction of the individual chamber. A first outer periphery of the piezoelectric body in the second region is interior of a second outer periphery of the individual chamber in the second region in the longitudinal direction. A gap region between the first outer periphery and the second outer periphery has: a first gap region having a first width in the longitudinal direction; and a second gap region having a second width in a transverse direction orthogonal to the longitudinal direction, the second width larger than the first width. The protective film covers a part of the first gap region in the second region.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 8A, 8B, and 8C are plan views of a liquid discharge head according to Comparative Example 2;

Figure 1:
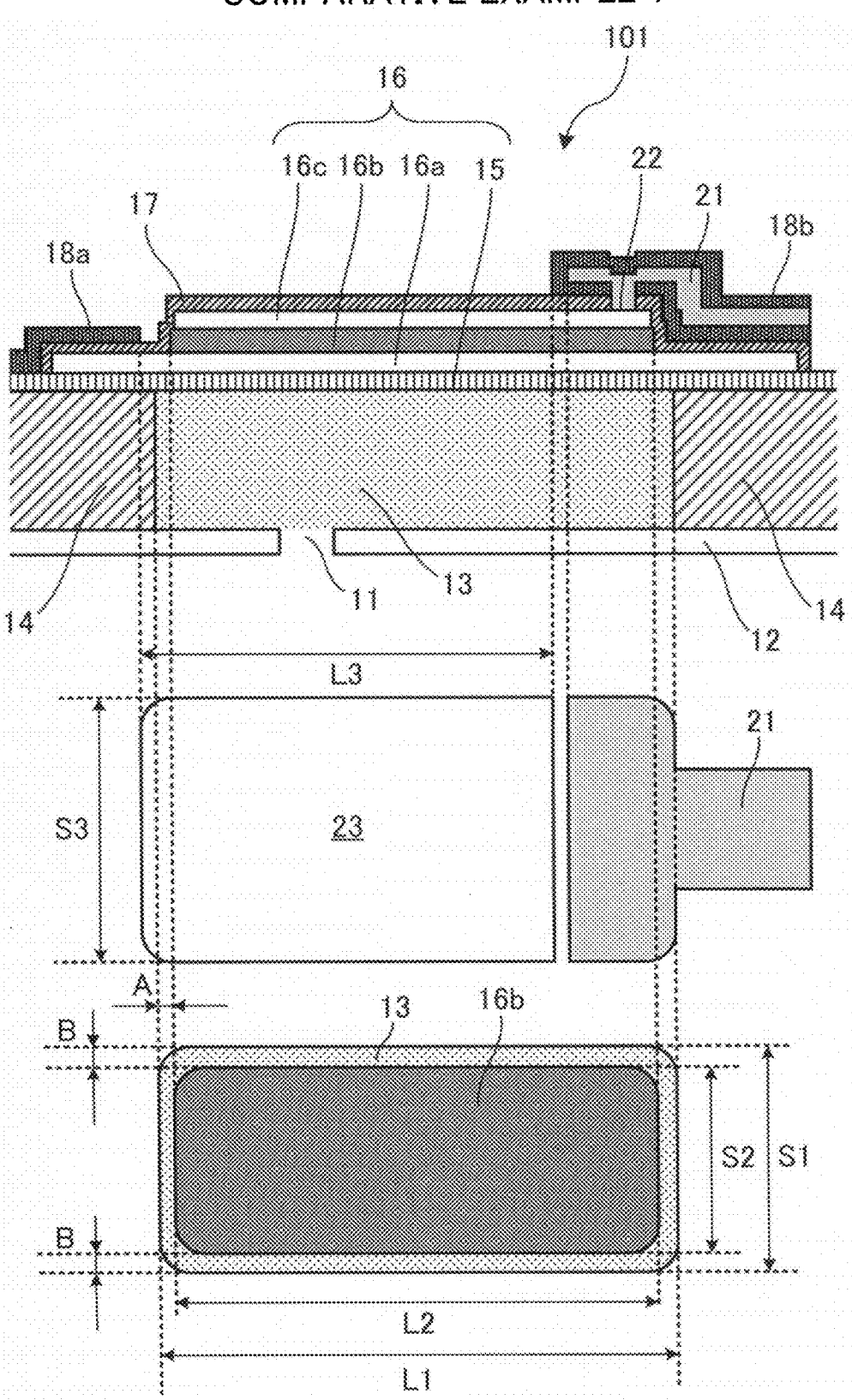
FIG. 1 is a cross-sectional view of a liquid discharge head according to Comparative Example 1 in its longitudinal direction, with an exploded view of the liquid discharge head in a plan view.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Referring now to the drawings, embodiments of the present disclosure are described below. As used herein, the singular forms "a." "an," and "the" are intended to include the plural forms as well, unless the context clearly indicates otherwise.

In order to increase the reliability of the liquid discharge head, breakage of the piezoelectric actuator is to be prevented. The piezoelectric actuator may be broken by a crack or dielectric breakdown. The dielectric breakdown may be avoided by optimizing the design of the components, or may be prevented from being mixed with foreign matter from the outside.

For the occurrence of cracks, screening of cracks is difficult because cracks occur due to various factors and at different timings. To prevent the occurrence of cracks due to stress, for example, the technique that provides a protective layer or a protective film for reinforcement so as to increase the stiffness of a liquid discharge head has been proposed.

In a comparative example, as a protective layer capable of suitably protecting an actuator while reducing or preventing a decrease in the displacement of the actuator, a central portion overlapping a part of an area close to the center of a pressurizing chamber in a perspective plan view is formed thinner than an outer peripheral portion extending from an inner side to an outer side of an edge portion of the pressurizing chamber in a perspective plan view.

However, such a comparative example that provides a protective film on the entire peripheral portion of the piezoelectric body inevitably faces a challenge of a reduction in the displacement efficiency of the piezoelectric body.

Embodiments of the present disclosure achieve a liquid discharge head that prevents the occurrence of a crack without impairing the displacement efficiency of the piezoelectric actuator.

Hereinafter, a liquid discharge head, a liquid discharge device, and a liquid discharge apparatus according to a present disclosure is described below with reference to the drawings. Note that the following embodiments are not limiting the present disclosure and any deletion, addition, modification, change, etc. can be made within a scope in which a person skilled in the art can conceive including other embodiments and any of which is included within the scope of the present disclosure as long as the effect and feature of the present disclosure are demonstrated.

The configuration of the liquid discharge head will be described with reference to FIGS. 1 to 3.

FIG. 1 is a cross-sectional view of a liquid discharge head according to Comparative Example 1 in its longitudinal direction and is also an exploded view of the liquid discharge head in a plan view seen from a lamination direction of a piezoelectric actuator. FIG. 2 is a plan view of the liquid discharge head according to Comparative Example 1 as viewed in the lamination direction of the piezoelectric actuator. FIG. 3 is a cross-sectional view of the liquid discharge head according to Comparative Example 1 in its traverse direction.

Figure 3:
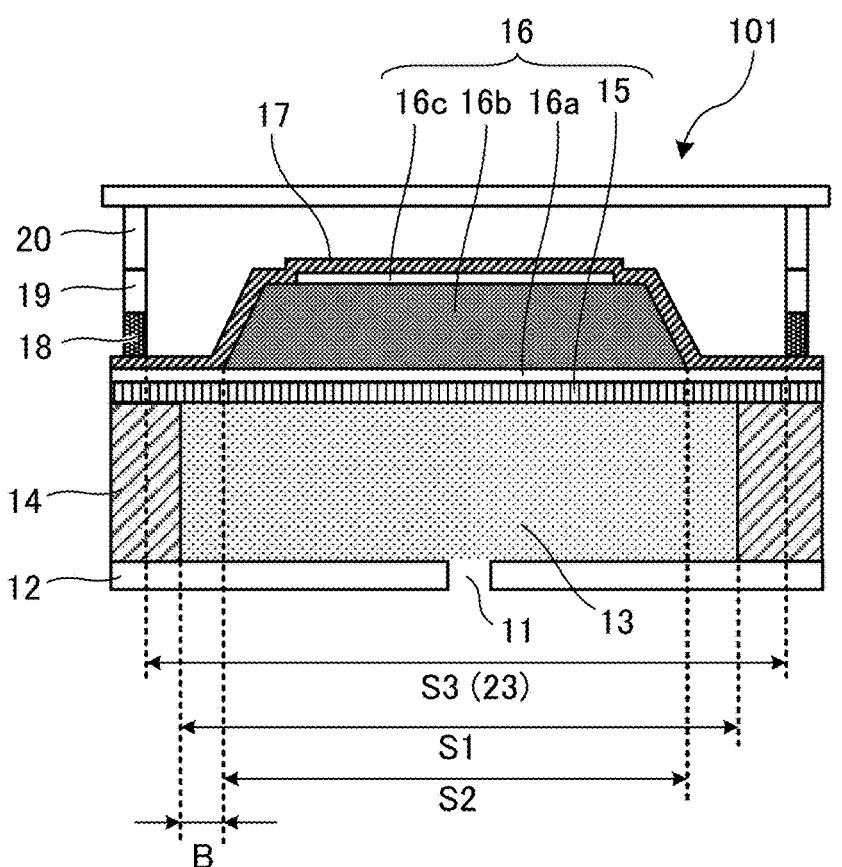
FIG. 3 is a cross-sectional side view of a liquid discharge head of Comparative Example 1 in its traverse direction of the liquid discharge head.

As illustrated in FIG. 1 and FIG. 3, a liquid discharge head 101 includes a nozzle plate 12 including nozzles 11 that discharge liquid droplets such as ink, and a liquid chamber substrate 14 (hereinafter simply referred to as "substrate") including individual liquid chambers 13 that communicate with the nozzles 11 and contain liquid.

The liquid discharge head 101 further includes piezoelectric actuators 16 on the substrate 14. Each of the piezoelectric actuators 16 includes a diaphragm 15 serving as one wall surface of the individual liquid chamber 13, a lower electrode 16a, and an upper electrode 16c, and a piezoelectric body 16b held between the lower electrode 16a and the upper electrode 16c.

The liquid discharge head 101 further includes a first protective film 17, a second protective film 18 (a protective film 18a and an insulating protective film 18b), a third protective film 19, and a subframe 20. The first protective film 17 covers the piezoelectric actuators 16.

The subframe 20 has a space for disposing the piezoelectric actuator 16. The liquid discharge head 101 also includes grooves serving as an ink flow path from the common liquid chamber to the individual liquid chamber 13.

In the piezoelectric actuator 16, the lower electrode 16a, the piezoelectric body 16b, and the upper electrode 16c are laminated. The lower electrode 16a serves as a common electrode closer to the diaphragm 15 than the upper electrode 16c. The piezoelectric body 16b is composed of, for example, a lead zirconate titanate (PZT) as an electromechanical transducer film. The upper electrode 16c is opposite to the lower electrode 16a with respect to the piezoelectric body 16b and serves as an individual electrode.

The lower electrode 16a is connected to a wiring portion 21 through a contact hole 22 in the first protective film 17 and connected to a pad electrode for the common electrode as a terminal electrode for external connection through the wiring portion 21.

The upper electrode 16c is connected to the wiring portion 21 through a contact hole 22 in the second protective film (more specifically, the insulating protective film 18b) and connected to a pad electrode for the individual electrode as a terminal electrode for external connection through the wiring portion 21.

A drive voltage having predetermined frequency and amplitude is applied between the lower electrode 16a and the upper electrode 16c through the wiring portion 21. In response to the application of the drive voltage, the piezoelectric body 16b vibrates to deform the diaphragm 15. The deformation of the diaphragm 15 pressurizes the liquid in the individual liquid chamber 13 and allows the nozzles 11 to discharge liquid droplets.

The first protective film 17 is preferably a moisture-proof film made of a material through which moisture in the atmosphere is less likely to permeate. Hereinafter, the first protective film 17 is also referred to as a moisture-proof film.

The moisture-proof film (i.e., the first protective film 17) has a thickness sufficient to achieve the intended protection performance of the piezoelectric actuators 16 and also to not hamper the deformation or displacement of the diaphragm 15. The thickness of the moisture-proof film (i.e., the first protective film 17) is preferably in a range of from 20 nm or greater to 100 nm or less.

The moisture-proof film having a thickness of 100 nm or greater (i.e., the moisture-proof film has a thick film) reduces the amount of deformation (displacement) of the diaphragm 15. Further, the moisture-proof film having a thickness of 20 nm or less (i.e., the moisture-proof film has a thin film) fails to serve as a sufficient protective layer of the piezoelectric actuators 16 and causes a decrease in the performance of the piezoelectric body 16b.

The second protective film 18 includes an insulating protective film 18b covering the wiring portion 21 and a protective film 18a covering a portion of a region in which the wiring portion 21 is not arranged.

In the following description, the term "protective film" simply refers to the protective film 18a.

The protective film 18a and the insulating protective film 18b of the second protective film 18 are simultaneously formed in the manufacturing process and are made of the same material. However, since the protective film 18a and the insulating protective film 18*b* are intended to have different functions, it is preferable to select a material that satisfies both functions.

Further preferably, the thickness of each of the protective film 18*a* and the insulating protective film 18*b* is appropriately selected or determined according to the intended function.

The insulating protective film 18*b* of the second protective film 18 withstands dielectric breakdown at voltages applied between the lower electrode 16*a* and the upper electrode 16*c*. The intensity of the electric field applied to the insulating protective film 18*b* is set in a range in which dielectric breakdown does not occur.

The protective film 18*a* has a compressive stress to prevent the occurrence of cracks in the piezoelectric actuators 16 in an embodiment of a liquid discharge head according to an embodiment of the present disclosure.

Examples of the material of the second protective film 18 may include any oxides, nitrides, carbides, or composite compounds thereof, or $SiO_2$ typically used in semiconductor devices.

The thickness of the second protective film 18 is equal to or greater than 200 nm in consideration of the surface properties of the underlying layer and pin holes, and is preferably equal to or greater than 500 nm.

As illustrated in the middle part of FIG. 1, the second protective film 18 has an opening 23 between the insulating protective film 18*b* and the protective film 18*a*. FIG. 1 indicates the longitudinal direction L3 and the traverse direction S3 of the opening 23. The second protective film 18 is not provided over the piezoelectric body 16*b* except for the vicinity of the wiring portion 21.

As illustrated in the lower part of FIG. 1, the piezoelectric body 16*b* is inside the individual liquid chamber 13 in a plan view (hereinafter, simply referred to as a "plan view") of the piezoelectric actuators 16 as viewed in the lamination direction of the piezoelectric actuators 16. FIG. 1 indicates the longitudinal direction L2 and the traverse direction S2 of the piezoelectric body 16*b*. Further, the longitudinal direction L1 and the traverse direction S1 of the individual liquid chamber is also indicated in FIG. 1.

The outer peripheral shape of each of the piezoelectric body 16*b* and the individual liquid chamber 13 is a rounded rectangular shape in the plan view.

Since the piezoelectric body 16*b* is inside the individual liquid chamber 13 in the plan view, a gap region exists between the first outer periphery of the piezoelectric body 16*b* and the second outer periphery of the individual liquid chamber 13. As illustrated in FIGS. 1 and 2, preferably, A is less than B (A<B) where A is a first width of the gap region in the longitudinal direction L1 or L2 (i.e., the distance between the first edge of the piezoelectric body 16*b* and the second edge of the individual liquid chamber 13 in the longitudinal direction L1 or L2), and B is a second width of the gap region in the traverse direction S1 or S2 (i.e., the distance between the first edge of the piezoelectric body 16*b* and the second edge of the individual liquid chamber 13 in the traverse direction S1 or S2). This relation between A and B reduces or prevents a tensile stress generated in the piezoelectric body 16*b* and increases the size of droplets discharged from the nozzles.

Figure 2:
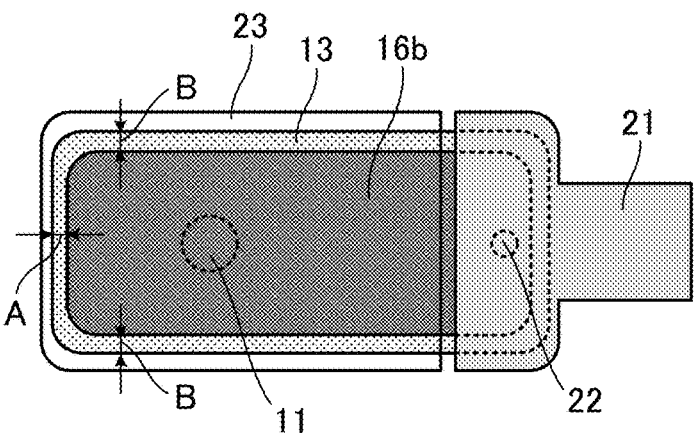
FIG. 2 is another plan view of the liquid discharge head of Comparative Example 1.

However, it is clear from the results of the stress distribution analysis that significant stress is applied to the left portion of the piezoelectric actuator 16 (i.e., the end portion of the piezoelectric actuator 16 in which the wiring portion 21 is not provided) in FIG. 2 in the configuration that satisfies the relation of A<B for the width of the gap region.

This means that in an aspect satisfying the relation of A<B for the width of the gap region, the piezoelectric actuator 16 (particularly, at least one of the piezoelectric body 16*b* and the diaphragm 15) may crack in response to a high load applied.

To deal with such a situation, A liquid discharge head 101 according to an embodiment of the present disclosure has a protective film 18*a* on the left portion of the piezoelectric actuator 16 (i.e., the end portion of the piezoelectric actuator 16 in which the wiring portion 21 is not provided) in FIG. 2 so as to prevent cracking of the piezoelectric actuator 16.

In the manufacturing process of the liquid discharge head 101 according to Comparative Example 1, the second protective film 18 is removed so as to form the opening 23 as illustrated in the middle stage of FIG. 1.

However, in the liquid discharge head according to an embodiment of the present disclosure, the protective film 18*a* is provided on a stress-concentrated area of the gap region between the first outer periphery of the piezoelectric body 16*b* and the second outer periphery of the individual liquid chamber 13. In other words, the protective film 18*a* is not removed from the stress-concentrated area of the gap region in the present embodiment, whereas the protective film 18*a* is removed from the entire area of the opening 23 according to Comparative Example 1. This configuration of the present embodiment allows a higher stress resistance. This prevents cracking of the piezoelectric actuators 16 irrespective of the high load applied.

The liquid discharge head 101 according to an embodiment of the present disclosure has the same configuration as that of the liquid discharge head according to Comparative Example 1 except for the area provided with the protective film 18*a*.

In other words, the liquid discharge head according to an embodiment of the present disclosure includes a nozzle plate 12, a liquid chamber substrate 14, a piezoelectric body 16*b*, a piezoelectric actuator 16, a wiring portion 21, a protective film 18*a*. The nozzle plate 12 has nozzles 11 formed therein to discharge liquids. The liquid chamber substrate 14 defines an individual liquid chamber 13 laminated on the nozzle plate 12 and communicating with the nozzles 11. The piezoelectric body 16*b* pressurizes the interior of the individual liquid chamber 13 through the diaphragm 15 that is a part of the individual liquid chamber 13. The piezoelectric actuator 16 includes a lower electrode 16*a*, an upper electrode 16*c*, and the piezoelectric body 16*b* between the lower electrode 16*a* and the upper electrode 16*c*. A drive voltage is applied to the piezoelectric actuator 16 through the wiring portion 21 to drive the piezoelectric actuator 16. The protective film 18*a* covers a part of an area not provided with the wiring portion 21 of the piezoelectric actuator 16. In a plan view of the piezoelectric actuator 16 as viewed in the lamination direction of the piezoelectric actuator 16, the piezoelectric body 16*b* is located on the inside of the individual liquid chamber 13. A gap region between the first outer periphery of the piezoelectric body 16*b* and the second outer periphery of the individual liquid chamber 13 has a first width in the longitudinal direction, a second width in the traverse direction, and a third width at a corner of the gap region. The first width, the second width, and the third width are different from each other. The protective film 18*a* is at one end portion of the piezoelectric actuator 16 in the longitudinal direction or the traverse direction, in whichever the width of the gap region is narrower, overlapping at least a part of the gap region.

In such an aspect, the protective film 18*a* is provided at one end of the piezoelectric actuator 16 (i.e., the left end portion of the piezoelectric actuator 16 in the longitudinal direction in FIG. 2) in the longitudinal direction or the traverse direction, in whichever the width of the gap region between the first outer periphery of the piezoelectric body 16b and the second outer periphery of the individual liquid chamber 13 is narrower. In this aspect, the area and the shape of the protective film 18a may be selected or determined appropriately within a range that does not significantly reduce the displacement efficiency of the piezoelectric body 16b.

The protective film 18a may be provided so as not to overlap the piezoelectric body 16b in the plan view (i.e., the plan view of the piezoelectric actuators 16 as viewed in the lamination direction of the piezoelectric actuators 16), or may be provided so as to overlap the piezoelectric body 16b within a range in which the displacement efficiency of the piezoelectric body 16b is not significantly reduced.

The protective film 18a may be provided so as to overlap a region including one side of the gap region at one end portion of the piezoelectric actuator in the longitudinal direction or the traverse direction, in whichever the width of the gap region is narrower between the first width and the second width, and corner portions continuous with the ends of said one side, respectively.

In the following description, similarly to FIGS. 1 and 2, the first width of the gap region in the longitudinal direction is narrower than the second width of the gap region in the traverse direction. Further, the wiring portion 21 is disposed at one end of the piezoelectric actuator 16 in the longitudinal direction.

In addition, the nozzle 11 is offset from the center portion of the individual liquid chamber 13 in a direction to one end portion of the piezoelectric actuator 16 in which the wiring portion 21 is not formed in the plan view. In other words, the nozzle 11 is between the center of the individual liquid chamber 13 and the one end portion of the piezoelectric actuator 16 in which the wiring portion 21 is not provided in the plan view. In FIG. 2 and the figures for which the following description is given, the position of the nozzle 11 is indicated by a dashed circle.

In the liquid discharge head 101 according to an embodiment of the present disclosure, the thickness of the protective film 18a preferably decreases toward the center portion of the individual liquid chamber 13 in the plan view. This configuration reduces or prevents a reduction in the displacement efficiency of the piezoelectric body 16b due to the presence of the protective film 18a covering the piezoelectric body 16b.

In some embodiments of the present disclosure, the first outer periphery of the piezoelectric body 16b and the second outer periphery of the individual liquid chamber 13 have a rounded rectangular shape in the plan view. However, no limitation is intended therein. The first outer periphery of the piezoelectric body 16b and the second outer periphery of the individual liquid chamber 13 may have another shape such as a circular shape or a polygonal shape.

First Embodiment

Figure 4A:
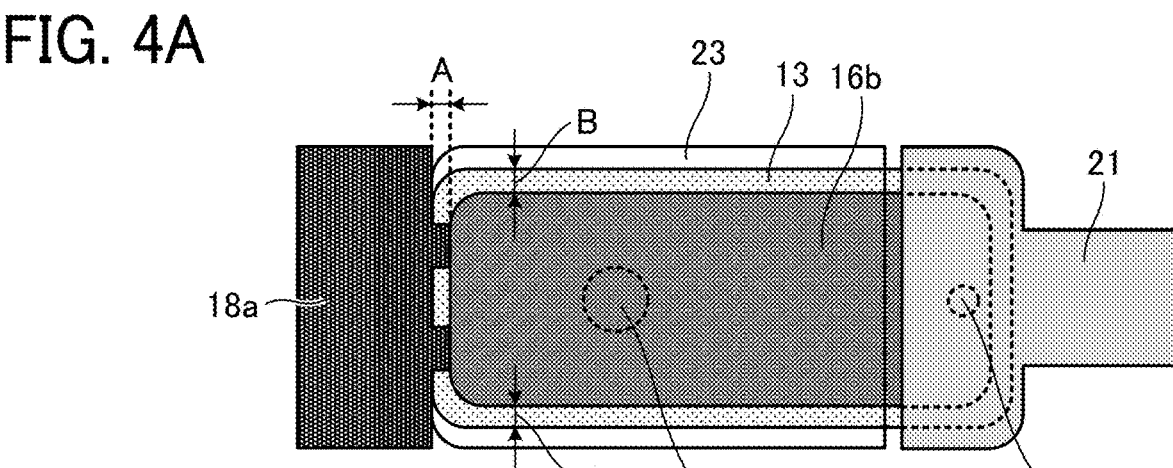
FIGS. 4A, 4B, and 4C are plan views of a liquid discharge head according to a first embodiment of the present disclosure.
Figure 4B:
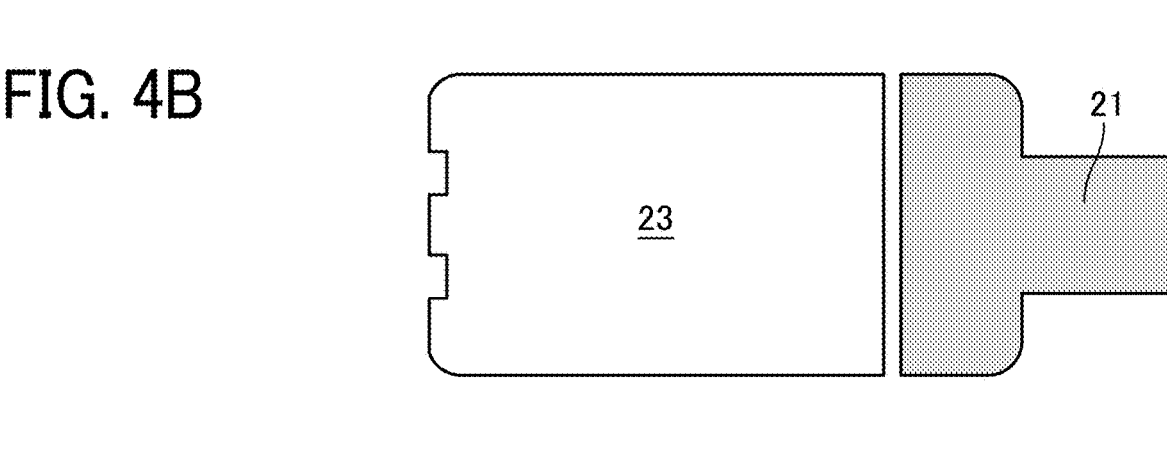
Figure 4C:
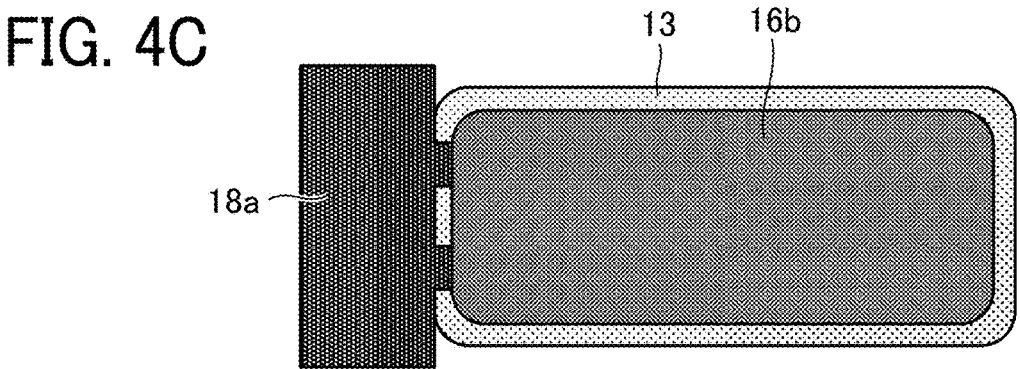

FIGS. 4A, 4B, and 4C are plan views of a liquid discharge head according to the first embodiment of the present disclosure.

FIG. 4A is an illustration of the relative position between the members with a nozzle 11 and a contact hole 22 indicated by dashed circles.

FIG. 4B is an illustration of an opening 23 of a second protective film (i.e., a protective film 18a and an insulating protective film 18b). FIG. 4C is an illustration of a region in which the protective film 18a is arranged.

As illustrated in FIG. 4A, A is less than B (A<B) where A is a first width of a gap region in the longitudinal direction (i.e., the distance between the first edge of the piezoelectric body 16b and the second edge of the individual liquid chamber 13 in the longitudinal direction), and B is a second width of the gap region in the traverse direction (i.e., the distance between the first edge of the piezoelectric body 16b and the second edge of the individual liquid chamber 13 in the traverse direction). The wiring portion 21 is at one end portion (i.e., the right side in FIG. 4A) of the piezoelectric actuator 16 in the longitudinal direction.

The protective film 18a is provided at one end of the piezoelectric actuator 16 (i.e., the left end portion of the piezoelectric actuator 16) in the longitudinal direction in which the first width is narrower than the second width. The protective film 18a is in an area where the wiring portion 21 of the piezoelectric actuators 16 is not provided. The protective film 18a overlaps a part of the gap region at one end of the piezoelectric actuator 16 in the longitudinal direction.

The protective film 18a is provided so as not to overlap the piezoelectric body 16b in the plan view. In other words, the protective film 18a is in one area, and the piezoelectric body 16b is in another area in the plan view.

The protective film 18a as illustrated in FIGS. 4A and 4C serves to reduce or prevent the deformation of the diaphragm 15 in the longitudinal direction and thus enables higher stress resistance. This prevents cracking of the piezoelectric actuators 16 irrespective of the high load applied.

More specifically, cracking of the diaphragm 15 and the piezoelectric body 16b is not observed after vibration of the diaphragm 15 one trillion times with a high Pull waveform (36 V, 120 kHz).

The protective film 18a overlapping with the piezoelectric body 16b in the plan view prevents the occurrence of a crack in the piezoelectric actuator 16 without loss of the displacement efficiency of the piezoelectric actuator 16 (or the piezoelectric body 16b).

Second Embodiment

Figure 5A:
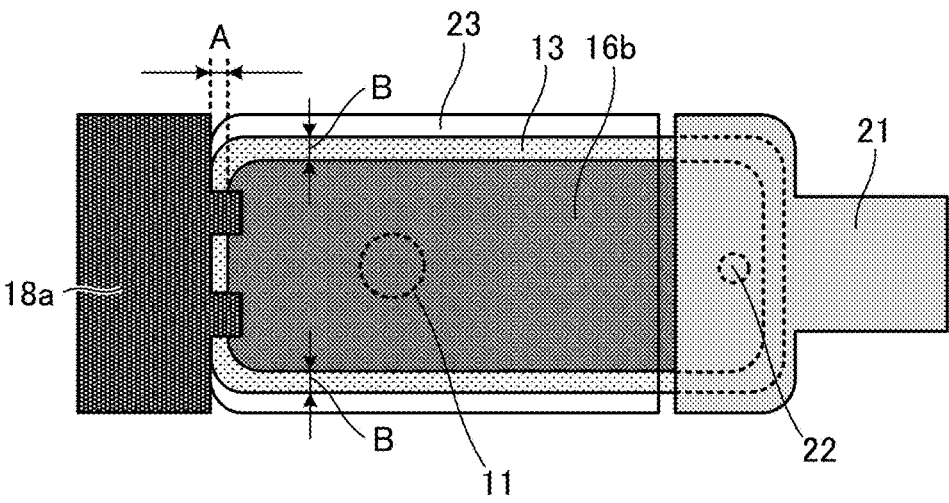
FIGS. 5A, 5B, and 5C are plan views of a liquid discharge head according to a second embodiment of the present disclosure.
Figure 5B:
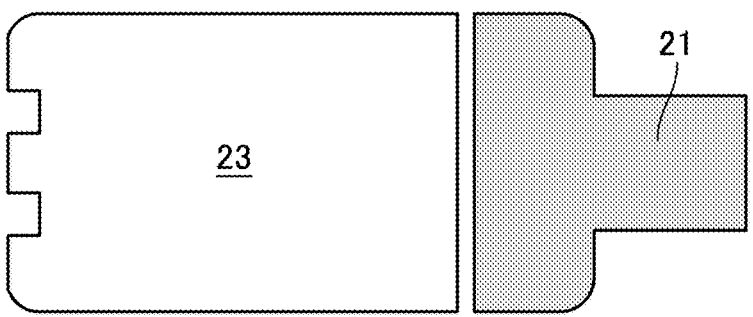
Figure 5C:
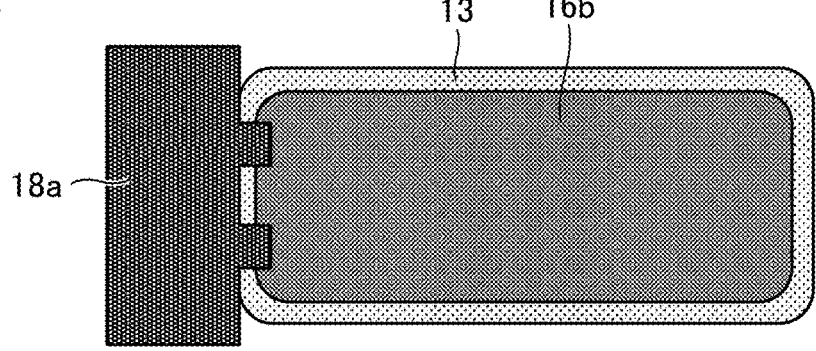

FIGS. 5A, 5B, and 5C are plan views of a liquid discharge head according to the second embodiment of the present disclosure.

FIG. 5A is an illustration of the relative position between the members with a nozzle 11 and a contact hole 22 indicated by dashed circles.

FIG. 5B is an illustration of an opening 23 of a second protective film (i.e., a protective film 18a and an insulating protective film 18b). FIG. 5C is an illustration of a region in which the protective film 18a is arranged.

As illustrated in FIG. 5A, A is less than B (A<B) where A is a first width of a gap region in the longitudinal direction (i.e., the distance between the first edge of the piezoelectric body 16b and the second edge of the individual liquid chamber 13 in the longitudinal direction), and B is a second width of the gap region in the traverse direction (i.e., the distance between the first edge of the piezoelectric body 16b and the second edge of the individual liquid chamber 13 in the traverse direction). The wiring portion 21 is at one end portion (i.e., the right side in FIG. 4A) of the piezoelectric actuator 16 in the longitudinal direction.

The protective film 18a is provided at one end of the piezoelectric actuator 16 (i.e., the left end portion of the piezoelectric actuator 16) in the longitudinal direction in which the first width is narrower than the second width. The protective film 18a is in an area where the wiring portion 21 of the piezoelectric actuator 16 is not provided. The protective film 18a overlaps a part of the gap region at one end of the piezoelectric actuator 16 in the longitudinal direction. The protective film 18a is provided so as to overlap a part of the piezoelectric body 16b in the plan view.

The protective film 18a as illustrated in FIGS. 5A and 5C serves to reduce or prevent the deformation of the diaphragm 15 in the longitudinal direction and thus enables higher stress resistance. This prevents cracking of the piezoelectric actuators 16 irrespective of the high load applied.

More specifically, cracking of the diaphragm 15 and the piezoelectric body 16b is not observed after vibration of the diaphragm 15 one trillion times with a high Pull waveform (36 V, 120 kHz).

The protective film 18a partly overlapping with the piezoelectric body 16b in the plan view prevents the occurrence of a crack in the piezoelectric actuator 16 without significant loss of the displacement efficiency of the piezoelectric actuator 16 (or the piezoelectric body 16b).

Third Embodiment

Figure 6A:
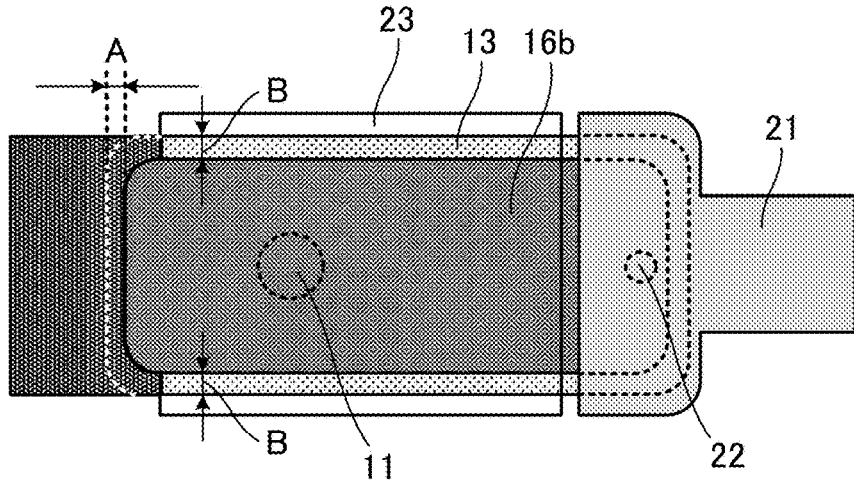
FIGS. 6A, 6B, and 6C are plan views of a liquid discharge head according to a third embodiment of the present disclosure.
Figure 6B:
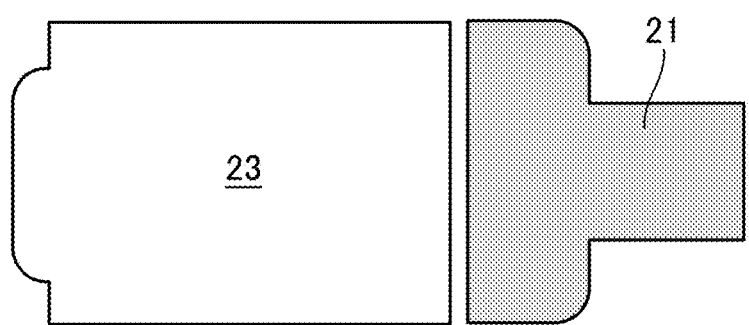
Figure 6C:
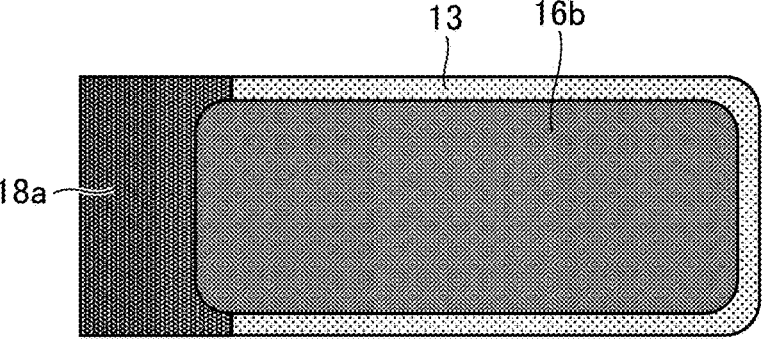

FIGS. 6A, 6B, and 6C are plan views of a liquid discharge head according to the third embodiment of the present disclosure.

FIG. 6A is an illustration of the relative position between the members with a nozzle 11 and a contact hole 22 indicated by dashed circles.

FIG. 6B is an illustration of an opening 23 of a second protective film (i.e., a protective film 18a and an insulating protective film 18b). FIG. 6C is an illustration of a region in which the protective film 18a is arranged.

As illustrated in FIG. 6A, A is less than B (A<B) where A is a first width of a gap region in the longitudinal direction (i.e., the distance between the first edge of the piezoelectric body 16b and the second edge of the individual liquid chamber 13 in the longitudinal direction), and B is a second width of the gap region in the traverse direction (i.e., the distance between the first edge of the piezoelectric body 16b and the second edge of the individual liquid chamber 13 in the traverse direction). The wiring portion 21 is at one end portion (i.e., the right side in FIG. 4A) of the piezoelectric actuator 16 in the longitudinal direction.

The protective film 18a is provided at one end of the piezoelectric actuator 16 (i.e., the left end portion of the piezoelectric actuator 16) in the longitudinal direction in which the first width of the gap region between the first outer periphery of the piezoelectric body 16b and the second outer periphery of the individual liquid chamber 13 is narrower than the second width of the gap region in the traverse direction. The protective film 18a is in an area where the wiring portion 21 of the piezoelectric actuator 16 is not provided. The protective film 18a covers a region including one side of the gap region at said one end of the piezoelectric actuator 16 in the longitudinal direction in which the first width is narrower than the second width, and the corner portions respectively being continuous with the ends of said one side. The protective film 18a is provided so as not to overlap the piezoelectric body 16b in the plan view. In other words, the protective film 18a is in one area, and the piezoelectric body 16b is in another area in the plan view.

The protective film 18a as illustrated in FIGS. 6A and 6C serves to reduce or prevent the deformation of the diaphragm 15 in the longitudinal direction and thus enables higher stress resistance. This prevents cracking of the piezoelectric actuators 16 irrespective of the high load applied.

More specifically, cracking of the diaphragm 15 and the piezoelectric body 16b is not observed after vibration of the diaphragm 15 one trillion times with a high Pull waveform (36 V, 120 kHz).

The protective film 18a overlapping with the piezoelectric body 16b in the plan view prevents the occurrence of a crack in the piezoelectric actuator 16 without loss of the displacement efficiency of the piezoelectric actuator 16 (or the piezoelectric body 16b).

Fourth Embodiment

Figure 7A:
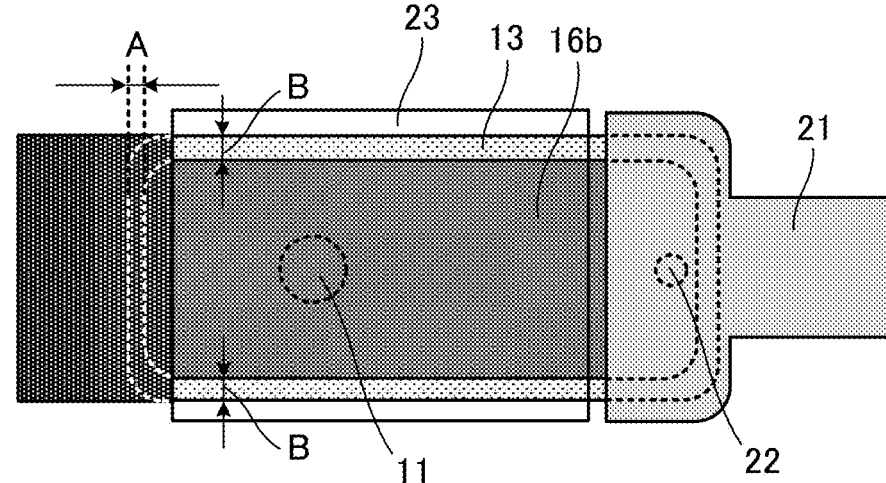
FIGS. 7A, 7B, and 7C are plan views of a liquid discharge head according to a fourth embodiment of the present disclosure.
Figure 7B:
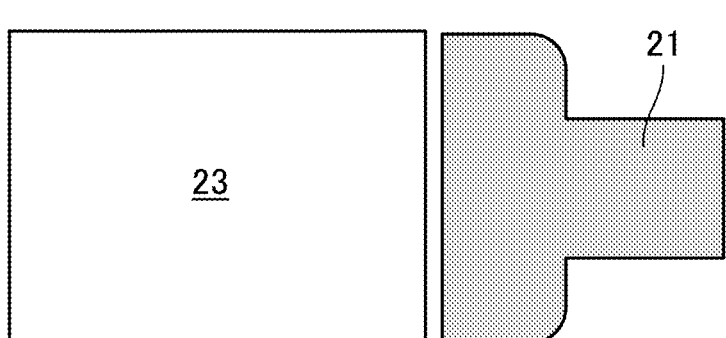
Figure 7C:
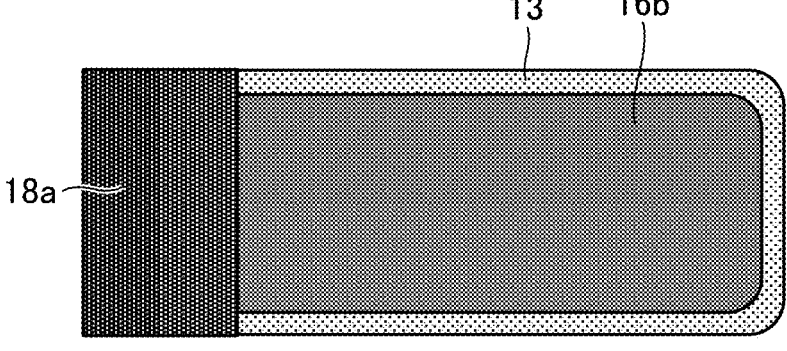

FIGS. 7A, 7B, and 7C are plan views of a liquid discharge head according to the fourth embodiment of the present disclosure.

FIG. 7A is an illustration of the relative position between the members with a nozzle 11 and a contact hole 22 indicated by dashed circles.

FIG. 7B is an illustration of an opening 23 of a second protective film (i.e., a protective film 18a and an insulating protective film 18b). FIG. 7C is an illustration of a region in which the protective film 18a is arranged.

As illustrated in FIG. 7A, A is less than B (A<B) where A is a first width of a gap region in the longitudinal direction (i.e., the distance between the first edge of the piezoelectric body 16b and the second edge of the individual liquid chamber 13 in the longitudinal direction), and B is a second width of the gap region in the traverse direction (i.e., the distance between the first edge of the piezoelectric body 16b and the second edge of the individual liquid chamber 13 in the traverse direction). The wiring portion 21 is at one end portion (i.e., the right side in FIG. 4A) of the piezoelectric actuator 16 in the longitudinal direction.

The protective film 18a is provided at one end of the piezoelectric actuator 16 (i.e., the left end portion of the piezoelectric actuator 16) in the longitudinal direction in which the first width of the gap region between the first outer periphery of the piezoelectric body 16b and the second outer periphery of the individual liquid chamber 13 is narrower than the second width of the gap region in the traverse direction. The protective film 18a is in an area where the wiring portion 21 of the piezoelectric actuator 16 is not provided. The protective film 18a covers a region including one side of the gap region at said one end of the piezoelectric actuator 16 in the longitudinal direction in which the first width is narrower than the second width, and the corner portions respectively being continuous with the ends of said one side. The protective film 18a is provided so as to overlap the piezoelectric body 16b in the plan view.

The protective film 18a as illustrated in FIGS. 7A and 7C serves to reduce or prevent the deformation of the diaphragm 15 in the longitudinal direction and thus enables higher stress resistance. This prevents cracking of the piezoelectric actuators 16 irrespective of the high load applied.

More specifically, cracking of the diaphragm 15 and the piezoelectric body 16b is not observed after vibration of the diaphragm 15 one trillion times with a high Pull waveform (36 V, 120 kHz).

The protective film 18a partly overlapping with the piezoelectric body 16b in the plan view prevents the occurrence of a crack in the piezoelectric actuator 16 without significant loss of the displacement efficiency of the piezoelectric actuator 16 (or the piezoelectric body 16b).

Comparative Example

Figures 8A, 8B, 8C:
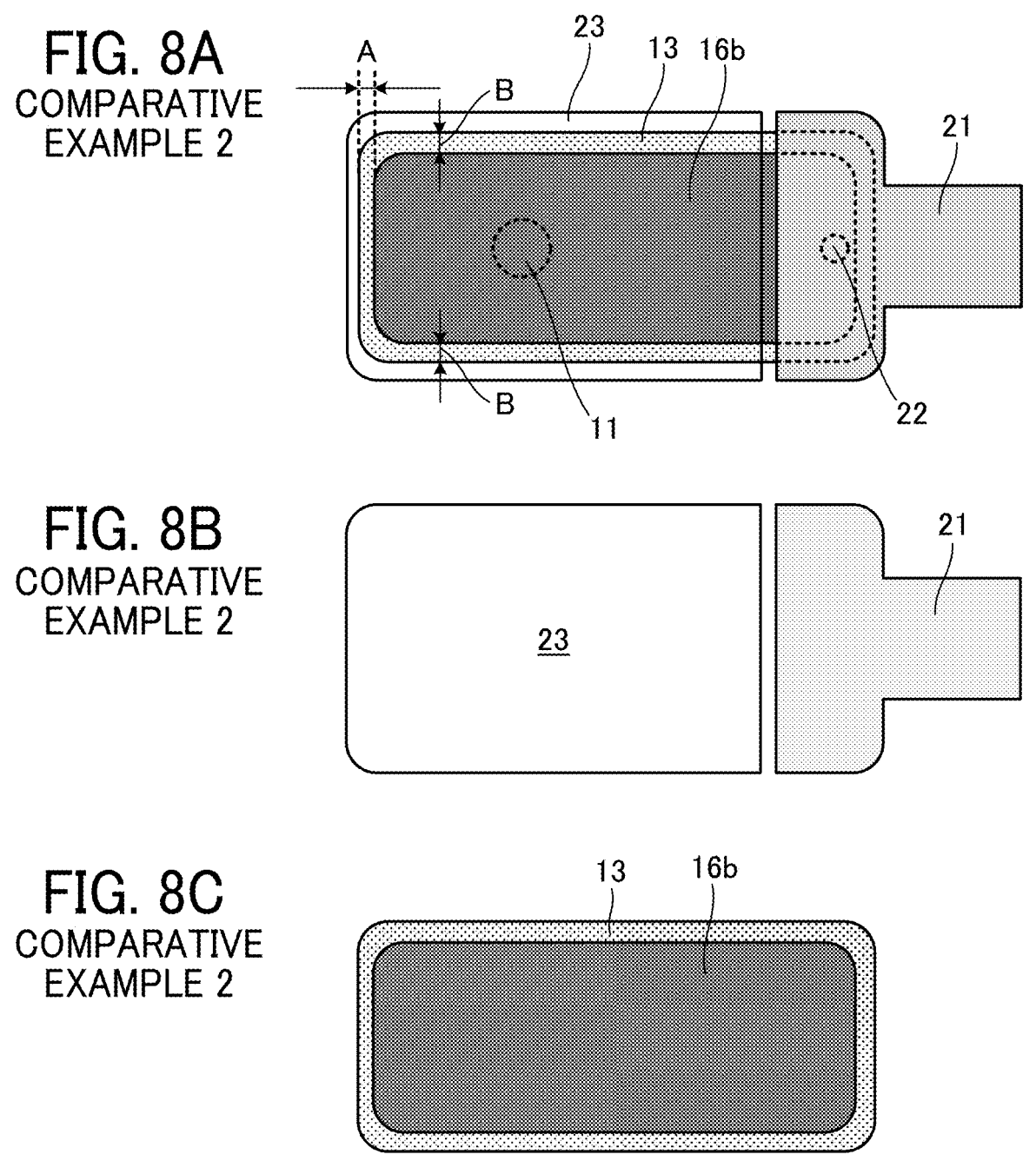

FIGS. 8A, 8B, and 8C are plan views of a liquid discharge head according to Comparative Example 2.

FIG. 8A is an illustration of the relative position between the members with a nozzle 11 and a contact hole 22 indicated by dashed circles.

FIG. 8B is an illustration of an opening 23 of a second protective film (i.e., a protective film 18a and an insulating protective film 18b). FIG. 8C is an illustration of a piezoelectric body 16b and an individual liquid chamber 13.

In the liquid discharge head according to Comparative Example 2 as illustrated in FIG. 8A, A is less than B (A<B) where A is a first width of a gap region in the longitudinal direction (i.e., the distance between the first edge of the piezoelectric body 16b and the second edge of the individual liquid chamber 13 in the longitudinal direction), and B is a second width of the gap region in the traverse direction (i.e., the distance between the first edge of the piezoelectric body 16b and the second edge of the individual liquid chamber 13 in the traverse direction). The wiring portion 21 is at one end portion (i.e., the right side in FIG. 4A) of the piezoelectric actuator 16 in the longitudinal direction.

In Comparative Example 2, the protective film 18a is not provided at one end of the piezoelectric actuator 16 (i.e., the left end portion of the piezoelectric actuator 16) in the longitudinal direction in which the first width of the gap region between the first outer periphery of the piezoelectric body 16b and the second outer periphery of the individual liquid chamber 13 is narrower than the second width of the gap region in the traverse direction. The protective film 18a is not provided in an area where the wiring portion 21 of the piezoelectric actuator 16 is not provided. This causes the left end portion of the piezoelectric actuator 16 in the longitudinal direction where the wiring portion 21 is not provided to get exposed to significant stress.

In the liquid discharge head according to Comparative Example 2, cracking of the diaphragm 15 and the piezoelectric body 16b was observed after vibration of the diaphragm 15 one trillion times with a high Pull waveform (36 V, 120 kHz).

Reference Example

Figures 9A, 9B, 9C:
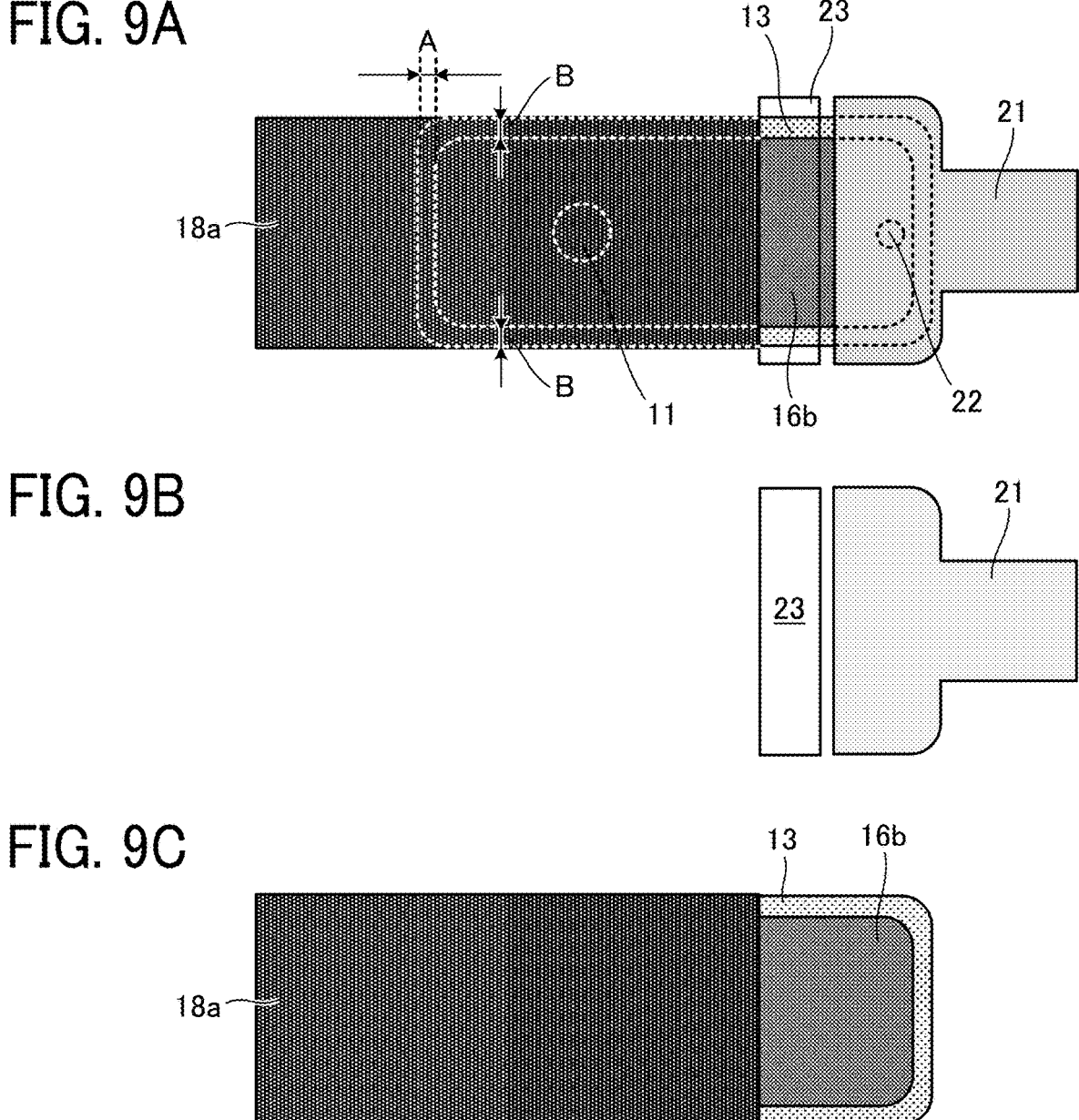
FIGS. 9A, 9B, and 9C are plan views of a liquid discharge head according to a reference example.

FIGS. 9A, 9B, and 9C are plan views of a liquid discharge head according to a reference example.

FIG. 9A is an illustration of the relative position between the members with a nozzle 11 and a contact hole 22 indicated by dashed circles.

FIG. 9B is an illustration of an opening 23 of a second protective film (i.e., a protective film 18a and an insulating protective film 18b). FIG. 9C is an illustration of a region in which the protective film 18a is arranged.

In the liquid discharge head according to a reference example as illustrated in FIG. 9A, A is less than B (A<B) where A is a first width of a gap region in the longitudinal direction (i.e., the distance between the first edge of the piezoelectric body 16b and the second edge of the individual liquid chamber 13 in the longitudinal direction), and B is a second width of the gap region in the traverse direction (i.e., the distance between the first edge of the piezoelectric body 16b and the second edge of the individual liquid chamber 13 in the traverse direction). The wiring portion 21 is at one end portion (i.e., the right side in FIG. 4A) of the piezoelectric actuator 16 in the longitudinal direction.

In the reference example, the protective film 18a is provided in an area where the wiring portion 21 of the piezoelectric actuators 16 so as to cover a region including: one end (i.e., the left end portion) of the piezoelectric actuator 16 in the longitudinal direction in which the first width of the gap region between the first outer periphery of the piezoelectric body 16b and the second outer periphery of the individual liquid chamber 13 is narrower than the second width of the gap region in the traverse direction; corner portions respectively being continuous with the ends of said one side; and the gap region having the second width in the traverse direction. The protective film 18a overlaps with the piezoelectric body 16b in the plan view.

In the reference example, the protective film 18a covers most of the region in which the wiring portion 21 of the piezoelectric actuators 16 including the individual liquid chamber 13 and the piezoelectric body 16b is not provided. This configuration of the reference example prevents or reduces the deformation of the diaphragm 15 in the longitudinal direction and enables higher stress resistance.

For example, cracking of the diaphragm 15 and the piezoelectric body 16b is not observed in the liquid discharge head after vibration of the diaphragm 15 one trillion times with a high Pull waveform (36 V, 120 zukHz).

However, it was observed that the protective film 18a covering the piezoelectric body 16b reduced the displacement efficiency of the piezoelectric body 16b and caused discharge failure.

From the results described above, in order to prevent the occurrence of cracks in the piezoelectric actuators 16 (the diaphragm 15 and the piezoelectric body 16b) without reducing the displacement efficiency of the piezoelectric body 16b, it is preferable to locally provide the protective film 18a in places where stresses are concentrated as in the first to fourth examples describe above.

Next, a head module incorporating a liquid discharge head according to an embodiment of the present disclosure, a liquid discharge head unit incorporating the head module, and a liquid discharge apparatus incorporating the liquid discharge head unit will be described.

Figure 10:
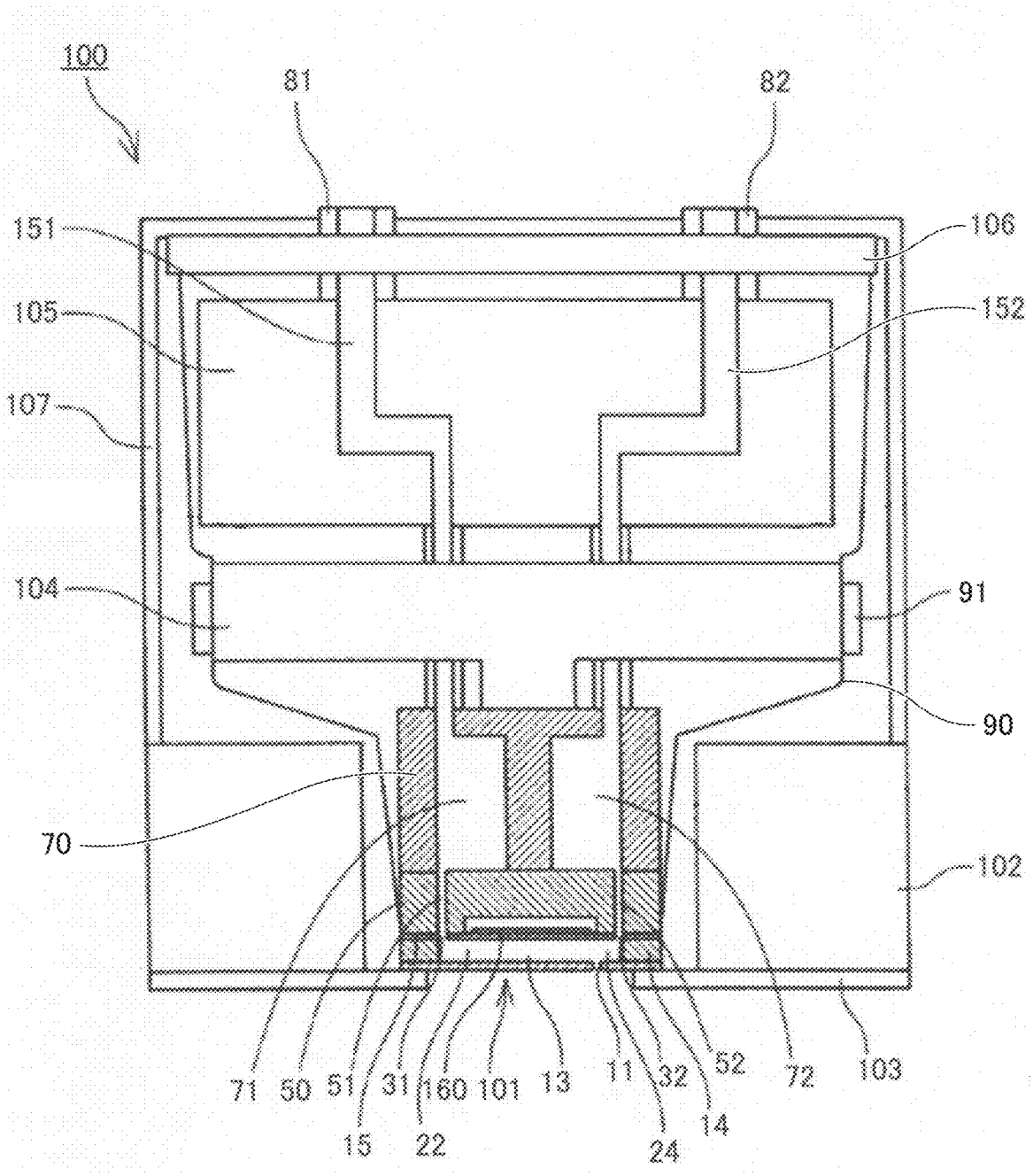
FIG. 10 is a cross-sectional view of a head module including a liquid discharge head in its traverse direction, according to an embodiment of the present disclosure.

FIG. 10 is a cross-sectional view of a head module including a liquid discharge head according to an embodiment of the present disclosure. FIG. 3 is an exploded perspective view of the head module as viewed from a face of the nozzle.

Note that, in FIG. 10, a part of the head module corresponding one of the liquid discharge head is illustrated.

The head module 100 includes multiple heads 101, the base member 102, the cover member 103, a heat radiator 104, a manifold 105, a printed circuit board (PCB) 106, and a module case 107. The head 101 discharges liquid from the nozzles 11.

Each of the heads 101 includes a nozzle plate 12, a liquid chamber substrate 14 (an individual channel plate), a diaphragm 15, an intermediate channel plate 50, and a frame 70 as a common channel member, for example. Nozzles 11 are formed in the nozzle plate 12. The liquid chamber substrate 14 includes individual liquid chambers 13 communicating with the nozzles 11, respectively. The diaphragm 15 includes piezoelectric elements 160. The intermediate channel plate 50 is laminated on the diaphragm 15. The frame 70 serving as a common channel member is laminated on the intermediate channel plate 50.

The liquid chamber substrate 14 (individual channel plate) includes a supply-side individual channel 22 communicating with the individual liquid chamber 13 and a recovery-side individual channel 24 communicating with the individual liquid chamber 13 together with the individual liquid chamber 13.

The intermediate channel plate 50 forms a supply-side intermediate individual channel 51 and a collection-side intermediate individual channel 52. The supply-side intermediate individual channel 51 communicates with the supply-side individual channel 22 via an opening 31 of the diaphragm 15. The collection-side intermediate individual channel 52 communicates with the collection-side individual channel 24 via an opening 32 of the diaphragm 15.

The frame 70 as a common channel member forms a supply-side common channel 71 and a collection-side common channel 72. The supply-side common channel 71 communicates with the supply-side intermediate individual channel 51. The collection-side common channel 72 communicates with the collection-side intermediate individual channel 52.

The supply-side common channel 71 communicates with a channel 151 of the manifold 105 via a supply port 81. The manifold 105 includes a supply port 181 communicating with an internal channel 151. The collection-side common channel 72 communicates with a channel 152 of the manifold 105 via a collection port 82. The manifold 105 includes a collection port 82 communicating with the internal channel 152.

The printed circuit board 106 and the piezoelectric element 160 of the head 101 are connected via a flexible wiring 90 and drive integrated circuits 91 (drive ICs) are mounted on the flexible wirings 90.

Figure 11:
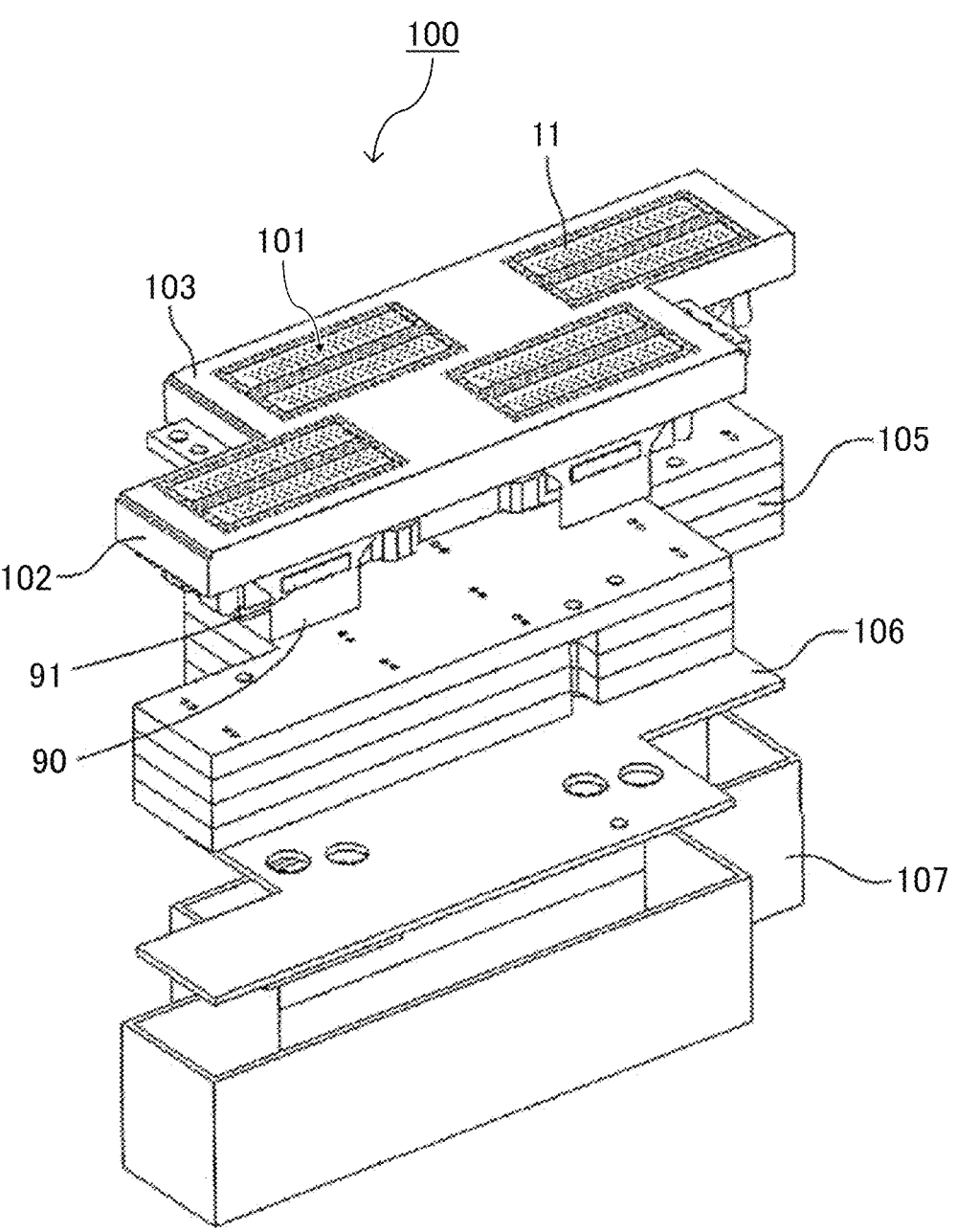
FIG. 11 is an exploded perspective view of a head module including the liquid discharge head in FIG. 10.

In the present disclosure, multiple heads 101 are mounted onto the base member 102 with a space provided between the heads 101. Specifically, as illustrated in FIG. 11, for example, two heads 1 arranged side by side in the transverse direction of the head 101 form one set. Four sets of the heads 1 are arranged in a staggered manner in a longitudinal direction of the head 1. Thus, the head module 100 includes eight heads 1 in FIG. 11.

The heat radiator 104 is disposed to face multiple heads 101 and the base member 102. Further, in the present embodiment, as described above, since the two heads 101 are arranged side by side in the transverse direction of the head 101, the heat radiator 104 is provided with through holes through which two flexible wires 90 of the adjacent heads 101 pass.

The module case 107 is attached to the base member 102 in the present embodiment. The module case 107 accommodates a part of the flexible wiring 90 including the printed circuit board 106 (PCB), the manifold 105, the heat radiator 104, and the driver IC 91 in the module case 107.

Each of port portions 80 includes the supply port 81 and the collection port 82 of the head 101. Some (e.g., four) of the port portions 80 are disposed outside the heat radiator 104 in the longitudinal direction of the heat radiator 104. Some (e.g., four) of the port portions 80 are disposed inside the through holes [104b] and protrude through the through holes formed in the heat radiator 104.

The port portion 80 protrudes from the upper surface of the heat radiator 104. The manifold 105 is disposed on the port portion 80. Thus, a gap is formed between the manifold 105 and the upper surface of the heat radiator 104.

The cover member 103 covers at least a part of the peripheral edge portions of the ejection surfaces of multiple heads 101, and all the peripheral edge portions in this embodiment.

The head module according to the present disclosure can be formed together with functional parts and mechanisms as a single unit (integrated unit) to constitute a liquid discharge device. For example, at least one of the configurations of the head module, a head tank, a carriage, a supply unit, a maintenance unit, a main scan moving unit, and the liquid circulation device may be combined together to form the liquid discharge device.

Examples of the "single unit" include a combination in which the head module and one or more functional parts and devices are secured to each other through, e.g., fastening, bonding, or engaging, and a combination in which one of the head module and the functional parts and devices is movably held by another. Further, the head module, the functional parts, and the mechanism may be configured to be detachable from each other.

Figure 12:
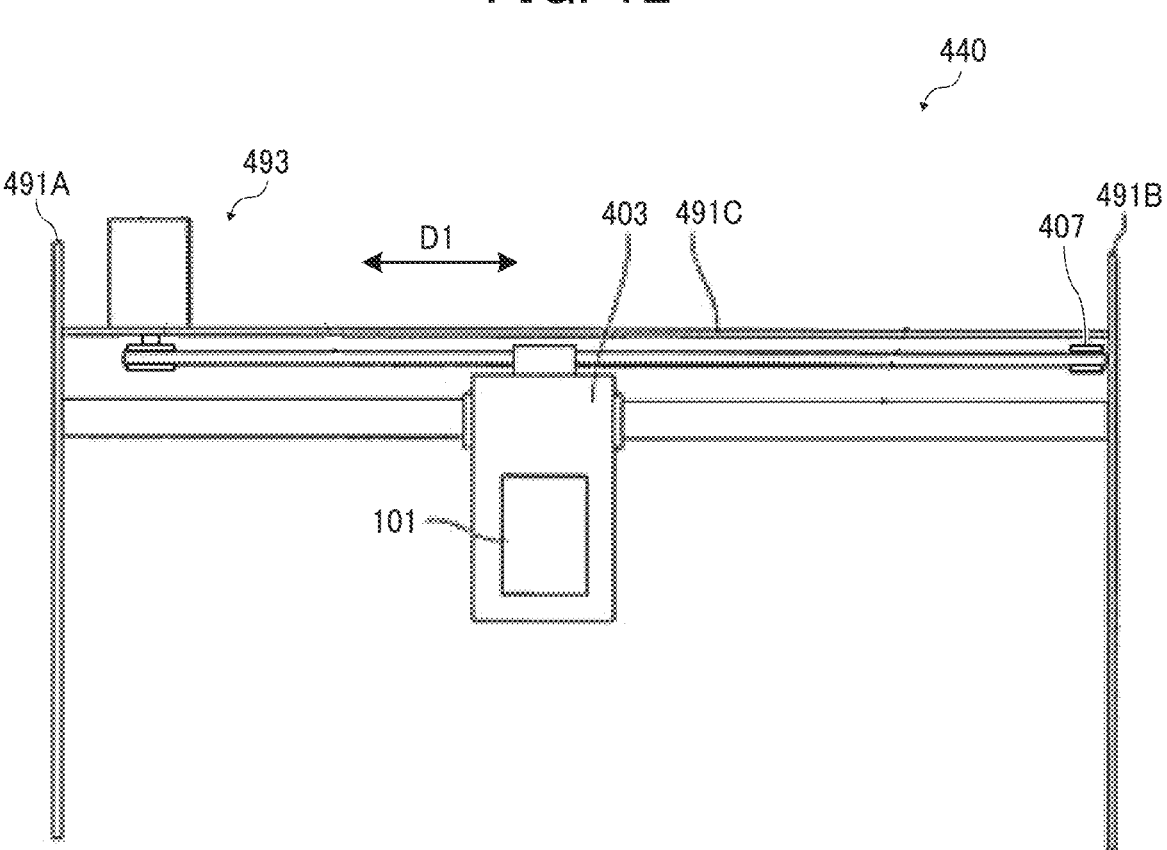
FIG. 12 is a plan view of a liquid discharge device according to an embodiment of the present disclosure.

FIG. 12 is a main plan view of an apparatus that discharges liquid, incorporating the liquid discharge head according to an embodiment of the present disclosure.

A liquid discharge unit 440 in FIG. 12 includes a housing including a left-side plate 491A, a right-side plate 491B, and a rear-side plate 491C, the main scan moving unit 493, the carriage 403, and the head 101 among components of the printer (liquid discharge apparatus). The main scanning direction is indicated by arrow "D1" in FIG. 12.

Note that, in the liquid discharge unit 440, the maintenance unit described above may be mounted on the right-side plate 491B, for example.

The term "liquid discharge apparatus" used herein is an apparatus including the head module or a liquid discharge device to drive the head to discharge liquid.

The liquid discharge apparatus may be, for example, an apparatus capable of discharging a liquid to a material to which liquid can adhere or an apparatus to discharge liquid toward gas or into liquid.

The liquid discharge apparatus may include devices to feed, convey, and eject the material on which liquid can adhere. The liquid discharge apparatus may further include a pretreatment apparatus to coat a treatment liquid onto the material, and a post-treatment apparatus to coat a treatment liquid onto the material, onto which the liquid has been discharged.

Figure 13:
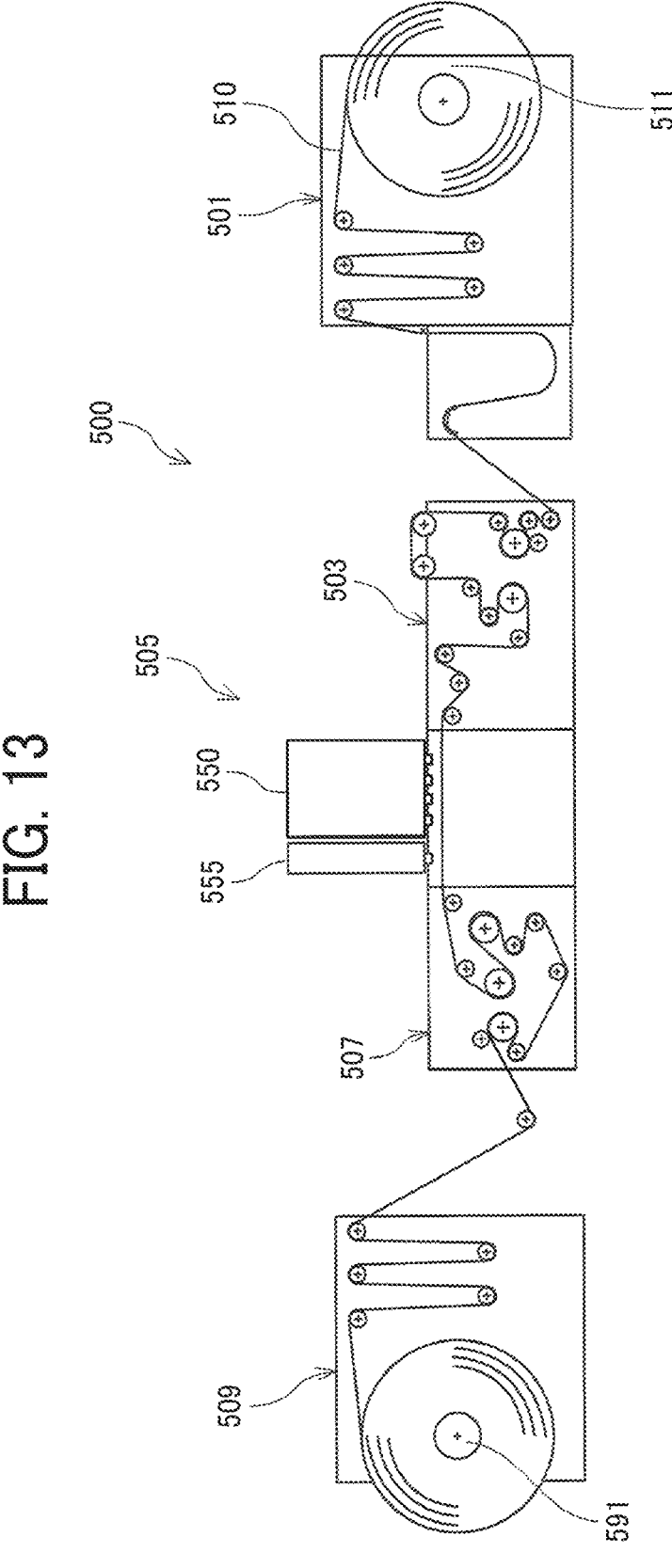
FIG. 13 is a plan view of a liquid discharge apparatus according to another embodiment of the present disclosure.

FIG. 13 is a schematic side view of an apparatus that discharges liquid, incorporating the liquid discharge head according to an embodiment of the present disclosure.

A printer 500 serving as the liquid discharge apparatus includes a feeder 501, a guide conveyor 503, a printing device 505, a dryer 507, and an ejector 509. The feeder 501 feeds a continuous medium 510 such as a rolled sheet. The guide conveyor 503 guides and conveys the continuous medium 510 such as a continuous paper or a rolled sheet, fed from the feeder 501, to the printing device 505. The printing device 505 discharges a liquid onto the continuous medium 510 to form an image on the continuous medium 510. The dryer 507 dries the continuous medium 510. The ejector 509 ejects the continuous medium 510.

The continuous medium 510 is fed from a winding roller 511 of the feeder 501, guided and conveyed with rollers of the feeder 501, the guide conveyor 503, the dryer 507, and ejector 509, and wound around a take-up roller 591 of the ejector 509.

In the printing device 505, the continuous medium 510 is conveyed on a conveyance guide to face a head unit 550 and a head unit 555. An image is formed with the liquid discharged from the head unit 550, and a post-processing is performed with a treatment liquid discharged from the head unit 555.

The term "liquid discharge apparatus" may be an apparatus to relatively move a head and a medium on which liquid can be adhered. However, the liquid discharge apparatus is not limited to such an apparatus.

For example, the liquid discharge apparatus may be a serial head apparatus that moves the head or a line head apparatus that does not move the head.

The above-described term "material onto which liquid can adhere" represents a material on which liquid is at least temporarily adhered, a material on which liquid is adhered and fixed, or a material into which liquid is adhered to permeate.

Examples of the material on which liquid can be adhered include any materials on which liquid can be adhered even temporarily, such as paper, thread, fiber, fabric, leather, metal, plastic, glass, wood, and ceramic.

Liquid to be discharged from the nozzles of the head is not limited to a particular liquid as long as the liquid has a viscosity or surface tension to be discharged from the head. However, preferably, the viscosity of the liquid is not greater than 30 mPa·s under ordinary temperature and ordinary pressure or by heating or cooling.

Aspects of the present invention are as follows, for example.

Aspect 1

A liquid discharge head includes: a nozzle plate including a nozzle from which a liquid is to be discharged; a liquid chamber substrate on the nozzle plate, the liquid chamber substrate having an individual chamber communicating with the nozzle; a diaphragm on the liquid chamber substrate, the diaphragm defining a part of a wall of the individual chamber; a piezoelectric actuator on the diaphragm, the piezoelectric actuator including a piezoelectric body configured to deform the diaphragm in response to a drive voltage applied to the piezoelectric body; a wiring portion connected to the piezoelectric actuator to apply the drive voltage to the piezoelectric body of the piezoelectric actuator, the wiring portion covering a first region of the piezoelectric actuator; and a protective film covering a second region of the piezoelectric actuator other than the first region. The first region is at one end of the piezoelectric actuator in a longitudinal direction of the individual chamber. The second region is at another end of the piezoelectric actuator in the longitudinal direction of the individual chamber. A first outer periphery of the piezoelectric body in the second region is interior of a second outer periphery of the individual chamber in the second region in the longitudinal direction. A gap region between the first outer periphery and the second outer periphery has: a first gap region having a first width in the longitudinal direction; and a second gap region having a second width in a transverse direction orthogonal to the longitudinal direction, the second width larger than the first width. The protective film covers a part of the first gap region in the second region.

Aspect 2

In the liquid discharge head of Aspect 1, the first gap region includes: a side of the second region having the first width; and corners at each end of the side, and the protective film covers the side and the corners.

Aspect 3

In the liquid discharge head of Aspect 1 or 2, the protective film does not cover the piezoelectric body in the second region.

Aspect 4

In the liquid discharge head of Aspect 1 or 2, the protective film covers a part of the piezoelectric body in the second region.

Aspect 5

In the liquid discharge head of any one of Aspect 1 to Aspect 4, the wiring portion is at said one end of the piezoelectric actuator in the longitudinal direction.

Aspect 6

In the liquid discharge head of Aspect 5, the nozzle is between a center of the individual chamber and said another end of the piezoelectric actuator in the longitudinal direction.

Aspect 7

In the liquid discharge head of any one of Aspect 1 to Aspect 6, each of the first outer periphery of the piezoelectric body and the second outer periphery of the individual chamber has a rectangular shape with rounded corners.

Aspect 8

In the liquid discharge head of any one of Aspect 1 to Aspect 7, the protective film has a compressive stress.

Aspect 9

In the liquid discharge head of any one of Aspect 1 to Aspect 8, the protective film has a thickness decreasing toward a center of the individual chamber in the longitudinal direction.

Aspect 10

A liquid discharge device includes the liquid discharge head of any one of Aspect 1 to Aspect 9.

Aspect 11

A liquid discharge apparatus includes the liquid discharge device of any one of aspect 1 to Aspect 9.

Aspect 12

In the liquid discharge head of Aspect 1, the protective film includes multiple protruding portions protruding toward the first region to cover multiple parts of the first gap region in the second region. The multiple protruding portions do not cover the piezoelectric body in the second region.

Aspect 13

In the liquid discharge head of Aspect 1, the protective film includes multiple protruding portions protruding toward the first region to cover multiple parts of the first gap region in the second region. The multiple protruding portions further cover multiple parts of the piezoelectric body in the second region.

The above is a description of exemplary embodiments of the present invention. The embodiments of the present invention are not limited to those described above, and various modifications are possible within the scope of the technical idea of the present invention. For example, the embodiments of the present application also include contents obtained by appropriately combining the embodiments explicitly described in the specification or the obvious embodiments.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A liquid discharge head, comprising:
a nozzle plate including a nozzle from which a liquid is to be discharged;
a liquid chamber substrate on the nozzle plate, the liquid chamber substrate having an individual chamber communicating with the nozzle;
a diaphragm on the liquid chamber substrate, the diaphragm defining a part of a wall of the individual chamber;
a piezoelectric actuator on the diaphragm, the piezoelectric actuator including a piezoelectric body configured to deform the diaphragm in response to a drive voltage applied to the piezoelectric body;
a wiring portion connected to the piezoelectric actuator to apply the drive voltage to the piezoelectric body of the piezoelectric actuator, the wiring portion covering a first region of the piezoelectric actuator; and a protective film, wherein the first region is at a first end of the piezoelectric actuator in a longitudinal direction of the individual chamber, a second region of the piezoelectric actuator is at a second end of the piezoelectric actuator opposite the first end in the longitudinal direction of the individual chamber, a first outer periphery of the piezoelectric body in the second region is interior of a second outer periphery of the individual chamber in the second region in the longitudinal direction, a gap region between the first outer periphery and the second outer periphery has:

a first gap region having a first width in the longitudinal direction; and a second gap region having a second width in a transverse direction orthogonal to the longitudinal direction, the second width larger than the first width, the protective film covers a part of the first gap region in the second region, the protective film includes multiple protruding portions protruding in the longitudinal direction toward the first region to cover multiple parts of the first gap region in the second region, the multiple protruding portions are arranged along the transverse direction, and the multiple protruding portions do not cover the piezoelectric body in the second region.

2. The liquid discharge head according to claim 1, wherein the first gap region includes:

a side of the second region having the first width; and corners at each end of the side, and the protective film covers the side and the corners.

3. The liquid discharge head according to claim 1, wherein the wiring portion is at the first end of the piezoelectric actuator in the longitudinal direction.

4. The liquid discharge head according to claim 3, wherein the nozzle is between a center of the individual chamber and the second end of the piezoelectric actuator in the longitudinal direction.

5. The liquid discharge head according to claim 1, wherein each of the first outer periphery of the piezoelectric body and the second outer periphery of the individual chamber has a rectangular shape with rounded corners.

6. The liquid discharge head according to claim 1, wherein the protective film has a compressive stress.

7. The liquid discharge head according to claim 1, wherein the protective film has a thickness decreasing toward a center of the individual chamber in the longitudinal direction.

8. A liquid discharge device comprising:

the liquid discharge head according to claim 1.

9. A liquid discharge apparatus comprising:

the liquid discharge device according to claim 8.

10. A liquid discharge head, comprising:

a nozzle plate including a nozzle from which a liquid is to be discharged;

a liquid chamber substrate on the nozzle plate, the liquid chamber substrate having an individual chamber communicating with the nozzle;

a diaphragm on the liquid chamber substrate, the diaphragm defining a part of a wall of the individual chamber;

a piezoelectric actuator on the diaphragm, the piezoelectric actuator including a piezoelectric body configured to deform the diaphragm in response to a drive voltage applied to the piezoelectric body;

a wiring portion connected to the piezoelectric actuator to apply the drive voltage to the piezoelectric body of the piezoelectric actuator, the wiring portion covering a first region of the piezoelectric actuator; and a protective film, wherein the first region is at a first end of the piezoelectric actuator in a longitudinal direction of the individual chamber, a second region of the piezoelectric actuator is at a second end of the piezoelectric actuator opposite the first end in the longitudinal direction of the individual chamber, a first outer periphery of the piezoelectric body in the second region is interior of a second outer periphery of the individual chamber in the second region in the longitudinal direction, a gap region between the first outer periphery and the second outer periphery has:

a first gap region having a first width in the longitudinal direction; and a second gap region having a second width in a transverse direction orthogonal to the longitudinal direction, the second width larger than the first width, the protective film covers a part of the first gap region in the second region, wherein the protective film includes multiple protruding portions protruding in the longitudinal direction toward the first region to cover multiple parts of the first gap region in the second region, the multiple protruding portions are arranged along the transverse direction, and the multiple protruding portions cover multiple parts of the piezoelectric body in the second region.

\* \* \* \* \*